United States Patent [19]
Golubchik et al.

[11] Patent Number: 5,412,540
[45] Date of Patent: May 2, 1995

[54] APPARATUS FOR REMOVABLY APPLYING A FLAT-PACK TO A SOCKET

[75] Inventors: Arkadiy Y. Golubchik; Donald K. Harper, Jr., both of Harrisburg; Michael F. Laub, Etters; David W. McMullen, Hershey, all of Pa.

[73] Assignee: The Whitaker Corporation, Wilmington, Del.

[21] Appl. No.: 95,133

[22] Filed: Jul. 20, 1993

[51] Int. Cl.⁶ .................... H05K 7/02; H01R 9/09
[52] U.S. Cl. .................... 361/807; 174/52.1; 174/52.4; 257/678; 257/704; 439/72; 439/73; 439/74
[58] Field of Search ............ 174/52.1, 52.3, 52.4; 206/331-334, 328, 329; 257/678, 704; 437/209, 216; 439/70-73, 74, 331, 526, 525; 361/728, 760, 807, 809, 820, 735

[56] References Cited
U.S. PATENT DOCUMENTS 4,427,247  1/1984  Petersen ................. 339/14 R
4,513,353  4/1985  Bakermans et al. ......... 439/71
5,007,845  4/1991  Grabbe .................. 439/73

Primary Examiner—Leo P. Picard
Assistant Examiner—Donald A. Sparks
Attorney, Agent, or Firm—June B. Schuette

[57] ABSTRACT

The contacts extending from the four sides of a flat-pack are releasably held against corresponding contacts extending from the sides of a socket for the flat-pack, by means of a cover comprising four arms pivotally mounted on the socket each near one of its four corners; by pivoting the arms downwardly against the tops of the flat-pack contacts, these contacts are pressed against, and held in positive contact with, the underlying socket contacts, and by pivoting the arms upwardly, the flat-pack can be released for removal and subsequent replacement. In addition, the cover is usefully mounted in position on the flat-pack even when the flat-pack is free of the socket, in which use it serves to protect the leads of the flat-pack in handling and during storage, for example.

5 Claims, 7 Drawing Sheets

APPARATUS FOR REMOVABLY APPLYING A FLAT-PACK TO A SOCKET

FIELD OF THE INVENTION

This invention relates to apparatus for removably applying an electronic package such as a flat-pack to a socket; it relates particularly to a cover which when installed clamps the flat-pack to the socket, with the contacts of the socket and flat-pack held in desired positive contact with each other. The cover is constructed to permit easy removal and replacement of the flat-pack. In addition, the cover is adapted to be carried on the flat-pack even when the flat-pack is free of the socket, to provide protection for the flat-pack leads.

BACKGROUND OF THE INVENTION

It is known to mount a socket for a flat-pack on a substrate, for example on a printed circuit (PC) board; this is typically done by soldering one end of the contacts of the socket to corresponding solder pads on the PC board. The socket is configured so that its contacts also mate with a corresponding set of contacts extending from a flat-pack superimposed on the socket. In order to maintain the contacts of the flat-pack in reliable, positive contact with those of the socket, and to hold the flat-pack onto the socket, it is further known to utilize a cover in the form of a frame which, when pressed against the top of the contacts of the flat-pack, forces them into positive engagement with the contacts of the socket, and holds them in this position. Such a cover is disclosed, for example, in copending U.S. patent application Ser. No. 08/023,287, of Harper, Jr. et al, filed Feb. 26, 1993 (AMP 15,424) now U.S. Pat. No. 5,314,223 and of common assignee herewith. A cover for somewhat similar purposes is disclosed in U.S. Pat. No. 5,027,845 of D. G. Grabbe, issued Apr. 16, 1991.

While effective for many purposes, due to the large number of contacts commonly employed such a cover typically requires large pressures to be exerted against it in order to force the flat-pack contacts into the desired positive-contact positions on the socket. For example, the flat-pack may have 196 contacts extending from it, which are to be forced into position against 196 corresponding socket contacts, an operation which may require of the order of 100 pounds of force applied between substrate and frame. Particularly where the application of the frame is to be by hand (for example in the field, when a faulty flat-pack is to be replaced, or an operative flat-pack is to be replaced with an upgraded flat-pack) the need for such large forces presents substantial practical problems.

Further, the contacts of the flat-pack are very fragile, i.e. easily bent or broken. Accordingly, it is desirable to protect them from such damage when they are being handled or stored.

Accordingly an object of this invention is to provide a method and apparatus for inserting an electronic package such as a flat-pack into a socket, which overcomes the need to apply large forces in so doing.

It is also an object to provide a cover which is useful for such purposes and which is easy to use and inexpensive to manufacture.

A further object is to provide such a cover which is easy to remove and replace when so desired.

Another object is to provide such apparatus which can be used as a temporary cover for a flat-pack to provide protection for its leads prior to its assembly on the socket.

SUMMARY OF THE INVENTION

These and other objects of the invention are achieved by the provision of a cover for an electronic package, for example a rectangular flat-pack, which cover takes the form of four interlockable arms, each pivotally mountable on and releasable from the socket. The term "rectangular" is used herein generically, to include "square", it being understood that many flat-packs are in fact square. Each arm is mountable on the socket so it can be pivoted along a different one of the sides of the flat-pack through positions such that, when the electronic package is on the socket, the downwardly-pivoting arm forces the electronic package contacts into positive contact with the socket contacts along the corresponding edge of the package and socket. Because each arm is responsible for acting on the electronic package contacts only along one of the four sides of the package, and because each pivoting arm acts progressively on successive groups of electronic package contacts, rather than simultaneously on all contacts along a given side, the force required from the user is many times smaller than if all contacts on all sides are forced together simultaneously as when using the unitary cover of the prior art; in addition, since each arm is mounted as a lever, a small force exerted to its free or distal end is sufficient to generate a substantially larger force on most of the package contacts, contributing further to the ease of operating the arms.

To mount the arms for their desired pivotal motion, a pivot structure is provided at each corner of the socket; preferably each pivot structure comprises a generally cylindrical sleeve bearing having a slot in one side by way of which a semi-cylindrical stub shaft on each arm can be inserted into, or removed from, the sleeve bearing, when desired.

In the preferred embodiment, a recess in the distal end of each cover arm fits snugly over a portion of an adjacent, orthogonally-disposed arm near its pivot end, to lock the arms securely in place when they are on the socket, or before application to the socket for purposes of protection of the leads, or even before application to the flat-pack.

Further, in a preferred embodiment, pads, or another retaining arrangement, are provided to act between the distal end of each arm and bevelled surfaces at corner extensions of the electronic package, such that when the package is fully installed in the arms of the cover, it is positively retained, thus remaining in position to protect the package contacts both before and after their installation on the socket.

The arms are preferably supplied as identical individual items, and may be assembled to form a coherent rectangular frame at the point of use, as a convenience in subsequent handling. The arms may later be separated from each other and separately snapped into their interlocking configuration on an electronic package, thus protecting the package contacts. To install the electronic package, the cover arms are removed from the electronic package, and the package is placed on the socket in the appropriate orientation and position; the stub shafts of the four arms are separately placed in their respective socket sleeve bearings, with the distal ends of the arms pointing upwardly, away from the electronic package. The arms are then rotated downwardly, preferably in turn and by increments, to force the electronic package contacts against the socket contacts until the distal end of each arm locks over its neighboring arm near its pivot end, at which point the package contacts and socket contacts are held in positive contact with each other by the lower edges of the arms.

To remove the electronic package, the distal end of each arm is moved upwardly to release it, and then pivoted fully upward; the package can then easily be pushed up out of the socket, when desired, for subsequent replacement.

BRIEF DESCRIPTION OF THE DRAWINGS

These and other objects and features of the invention will be more readily understood from a consideration of the following detailed description, taken with the accompanying drawings, in which.

DETAILED DESCRIPTION OF PREFERRED EMBODIMENTS

Figure 1:
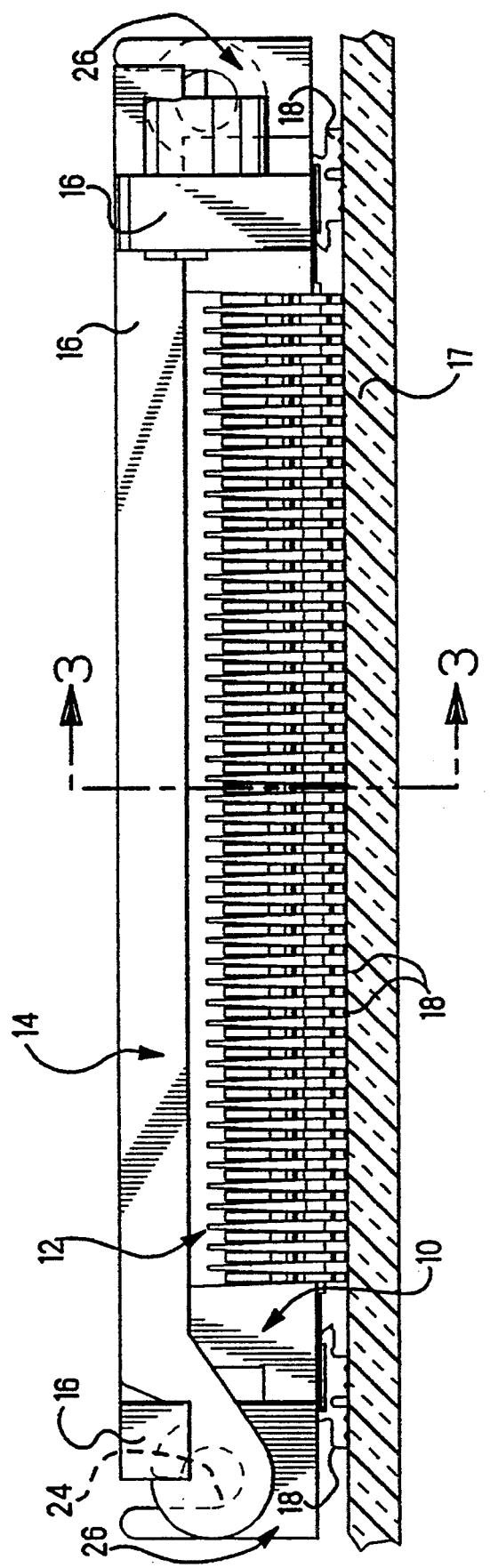
FIG. 1 is a side elevational view of an assembly of a socket and a flat-pack, and of a cover for holding them together, in accordance with a preferred embodiment of the invention.
Figure 4:
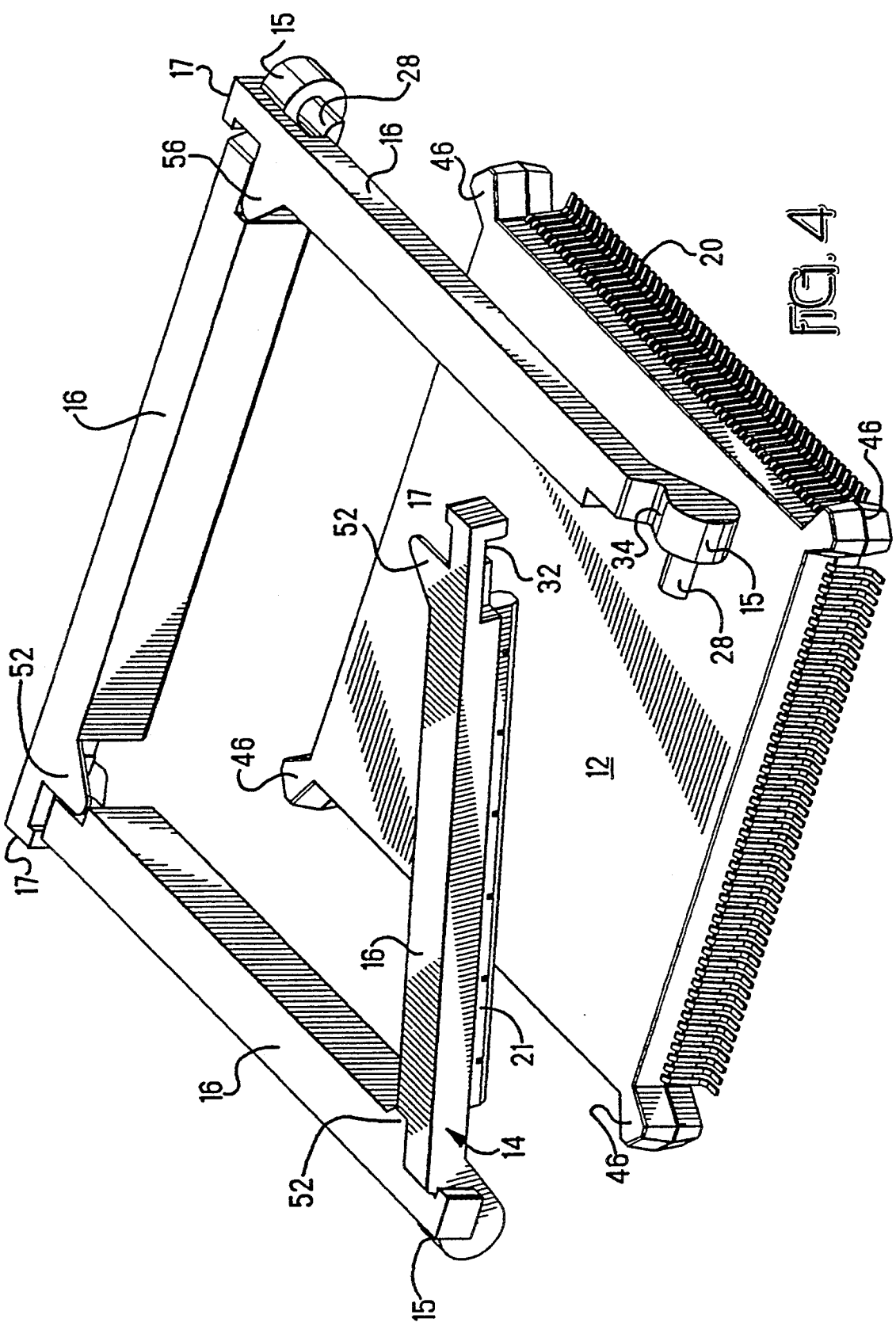
FIG. 4 is a perspective view, taken obliquely from above, showing the flat-pack beneath the cover with three of the cover arms snapped together and the fourth one about to be snapped into position to complete the cover.

Referring now to the preferred embodiment of the invention shown in the drawings by way of example only, and without thereby in any way limiting the scope of the invention, FIG. 1 shows a side elevational view of a completely assembled combination of a socket 10, a flat-pack 12, and a cover 14 made up of four cover arms 16 (FIG. 4). The socket of FIG. 1 is similar to a previously known form shown and described in the above-identified U.S. Pat. No. 5,027,845, except that, as will be described later herein, it is modified at its corners to mount the pivotable cover arms 16. The flat-pack 12 is also conventional, and may for example be a 196-contact PQFP made, for example by Intel. It is understood that the socket 10 is conventionally secured to a PC board 17 by means not shown.

Figure 2:
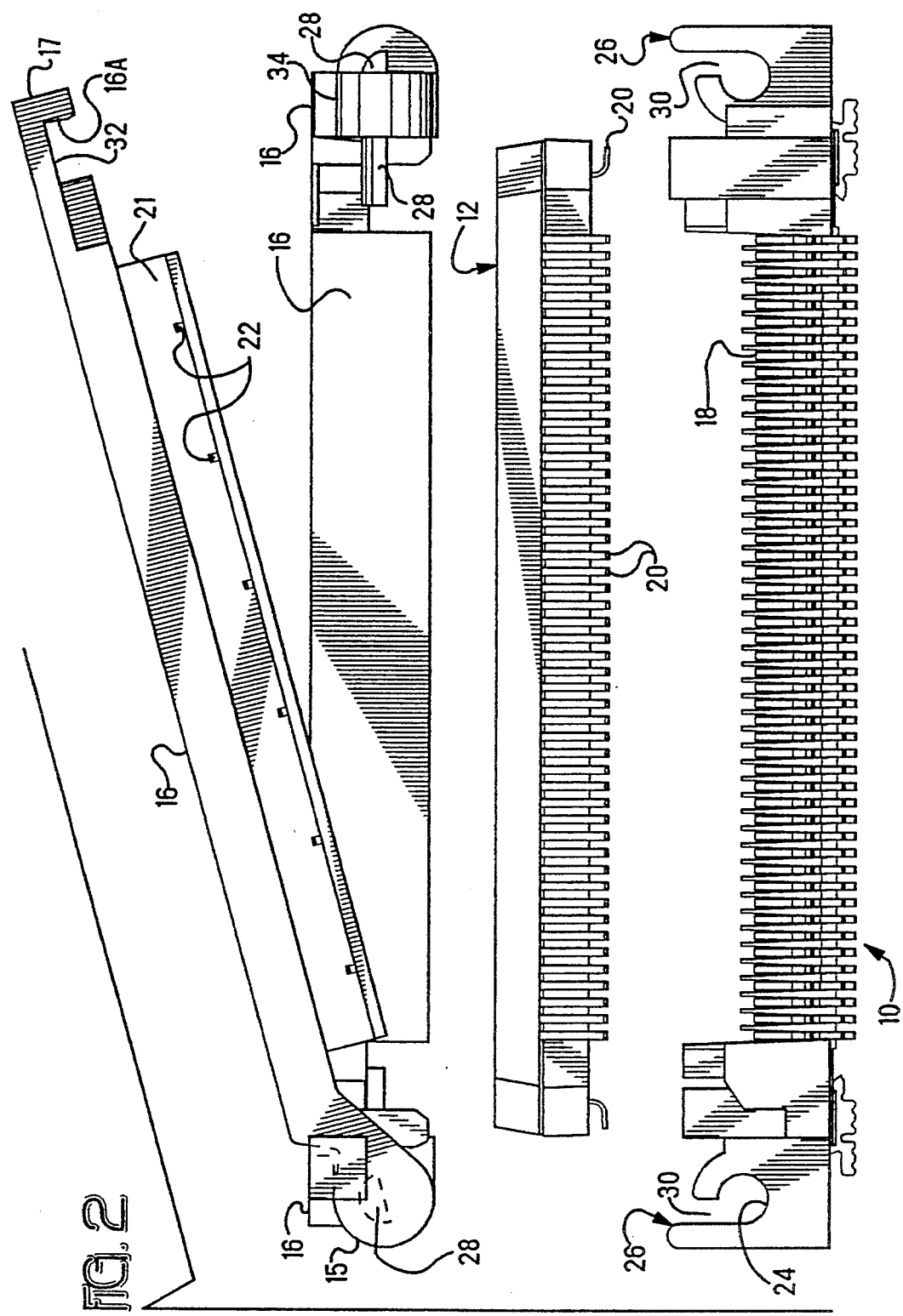
FIG. 2 is a side elevational exploded view showing the socket, flat-pack and cover separately but in vertical alignment with each other, and with the nearest arm pivoted upwardly.
Figure 3:
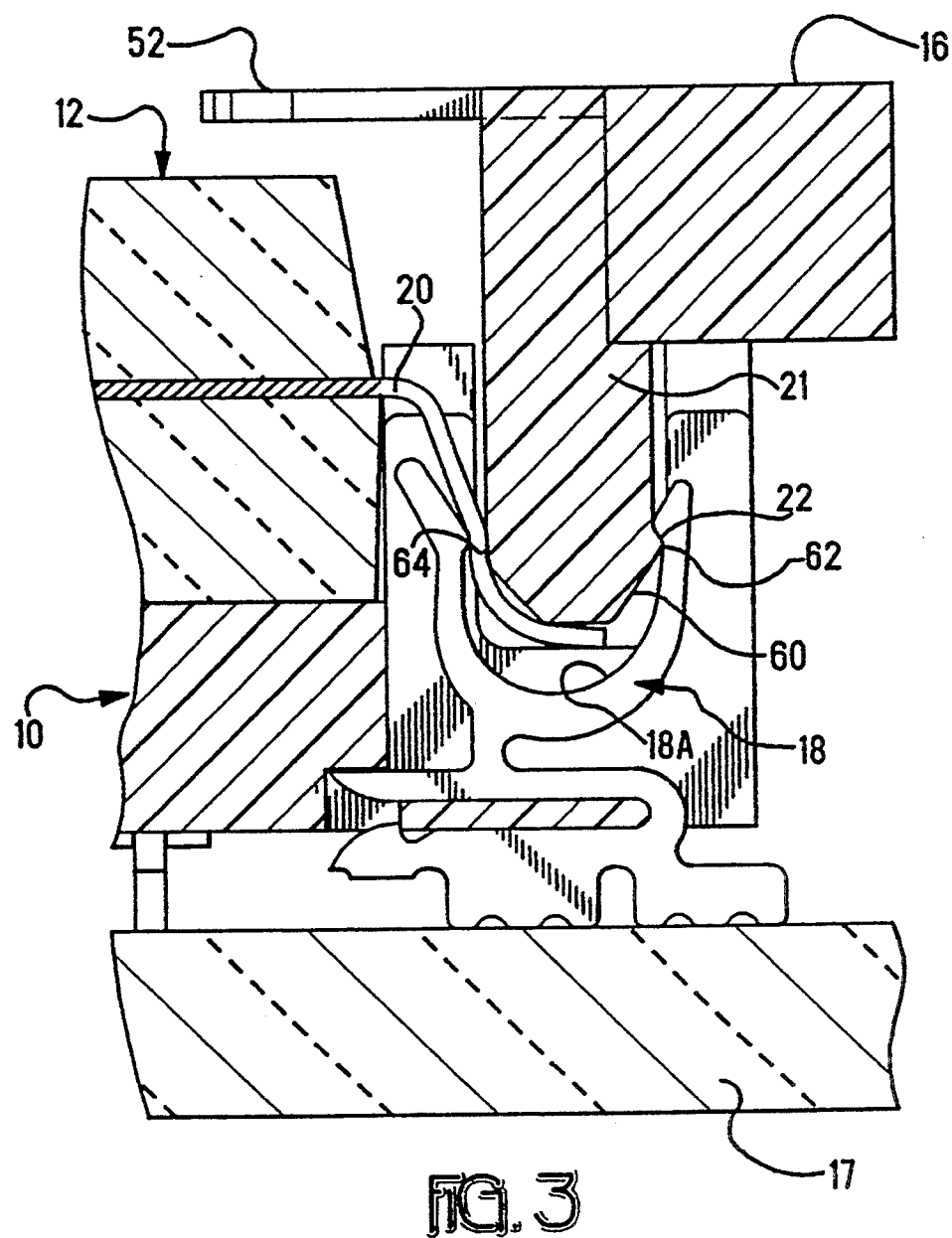
FIG. 3 is an enlarged sectional view taken along lines 3—3 of FIG. 1, showing mating contacts of the type used in the socket and flat-pack of this preferred embodiment of the invention.

The socket contacts 18 extend identically along all four edges of the socket, and each socket contact may be of the so-called "tuning fork" type shown at the lower right in FIG. 2, and in FIG. 3. Similarly, flat-pack contacts 20, in corresponding numbers and positions, are provided in conventional manner along all four sides of the flat-pack, and each may be as shown for example in FIG. 2. The assembly of socket contacts 18 along each edge of the socket 10 forms a trough, and the flat-pack contacts 20 disposed along the edges of the flat-pack 12 form rows of contacts 20 designed to fit downwardly into the troughs 18A formed by the socket contacts 18, as also shown clearly in FIG. 3, so the flat-pack contacts 20 can be pressed into position in positive contact with the socket contacts 18 by the blade-like lower portions 21 (FIG. 2) of the pivotable arms 16. A series of raised bosses 22 extend along the outer side of each arm (FIGS. 2 and 3), and assist in retaining the cover arms 16 in the socket contacts 18 after assembly.

Referring to FIGS. 1 and 2, the socket 10 is seen to have at each corner a pivot structure, in this example comprising a cylindrical sleeve bearing 24 in a plastic corner piece 26 integral with the socket 10, this sleeve bearing 24 receiving a pivotable stub shaft 28 (see also FIG. 4) provided on each cover arm 16. The pivotable stub shaft 28 is semi-cylindrical, and a slot 30 (FIG. 2) is provided through the wall of the sleeve bearing 24 so that the stub shaft 28 can be slipped into the sleeve bearing 24 when the arm 16 is oriented in a nearly straight-upward position.

Shown in FIG. 2 is the flat-pack 12 positioned in alignment over the socket 10, so that by moving it downward the contacts 18,20 of flat-pack 12 and socket 10 align themselves appropriately, as shown in FIG. 3. The cover 14 is shown in FIG. 2 above the flat-pack 12, in alignment therewith, so that, when the arms 16 are separately installed on their respective corner pieces 26, the contacts 20 of the flat-pack 12 can be urged into the troughs 18A formed by the socket contacts 18 as shown in FIG. 3, to provide the desired positive contact between flat-pack 12 and socket 10 contacts 20,18.

Figure 5:
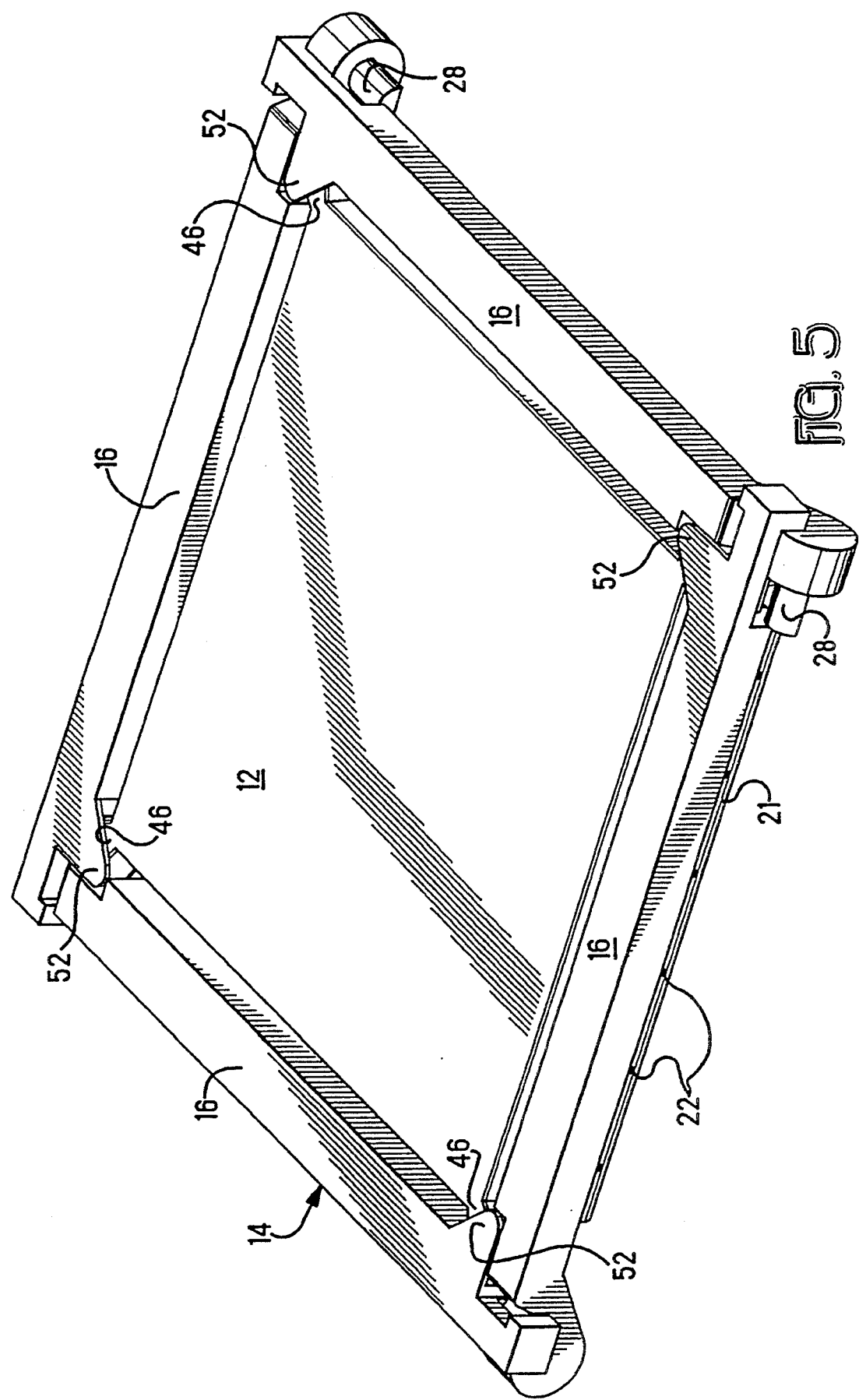
FIG. 5 is a perspective view, taken obliquely from the top, showing the cover in position on the flat-pack to protect the leads of the flat-pack.
Figure 6:
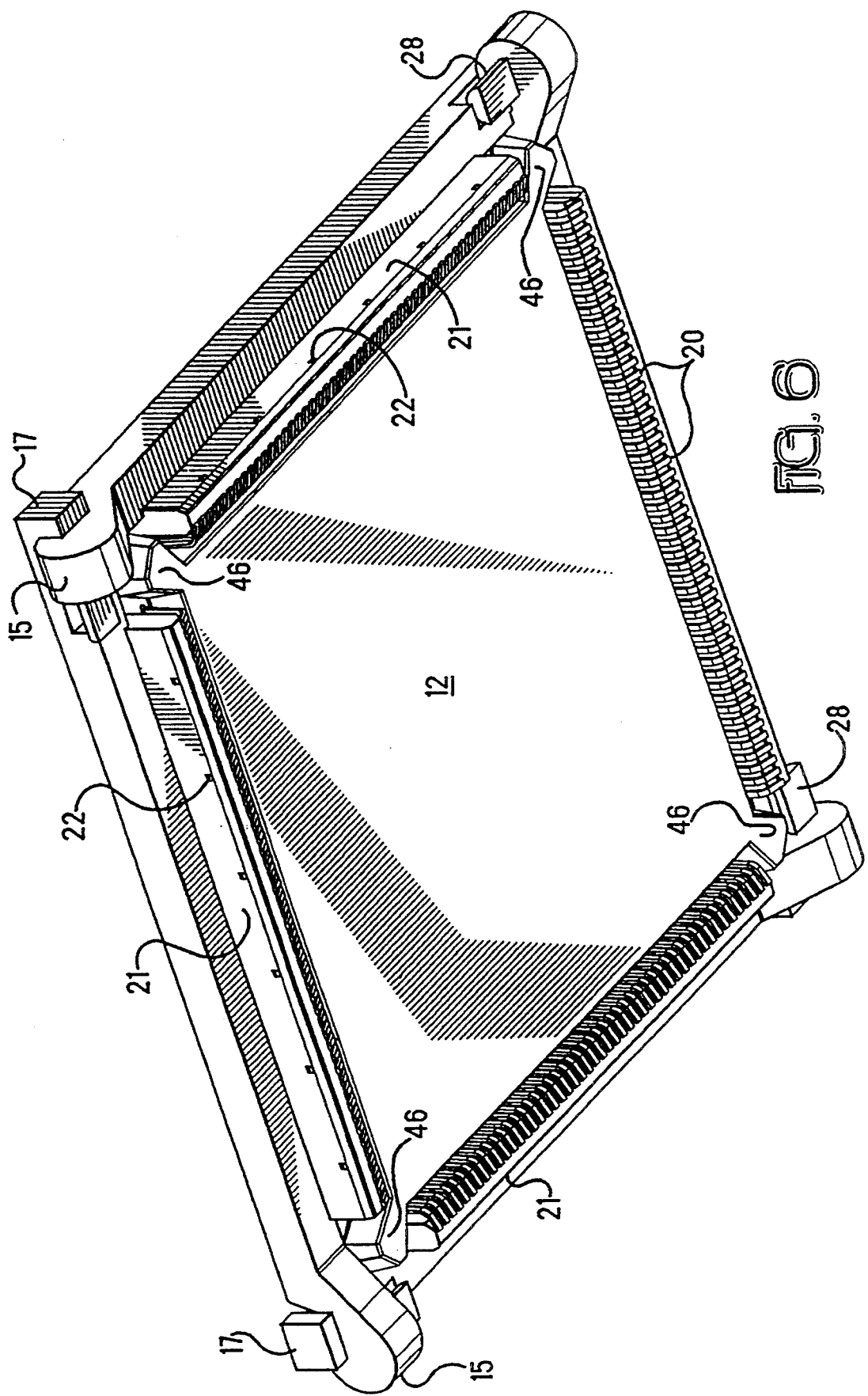
FIG. 6 is a perspective view, taken obliquely from the bottom of the cover-and-flat-pack assembly of FIG. 5.

The set of four identical arms 16 forming the cover are shown partially assembled in FIG. 4, and completely assembled in FIGS. 5 and 6. Each arm is provided with a recess 32 (FIGS. 2 and 4) which fits snugly over a corresponding portion 34 of an adjacent arm 16 near its pivot end 15, whereby when all four arms 16 are placed into position with the recesses 32 encompassing the adjacent pivot arms 16, they form a stable quadrilateral assembly that is the cover 14. To assure that the arms 16 will securely engage each other, they are made of a material and in a configuration having an appropriate degree of transverse springiness, and the surface 16A near the end of each arm (FIG. 2) makes slightly less than a right angle with the longitudinal axis of the arm 16 to provide a force fit and a locking action. The latter quadrilateral assembly is readily taken apart by merely pivoting each arm 16 upward from its closed position on the adjacent arm 16.

Figure 7:
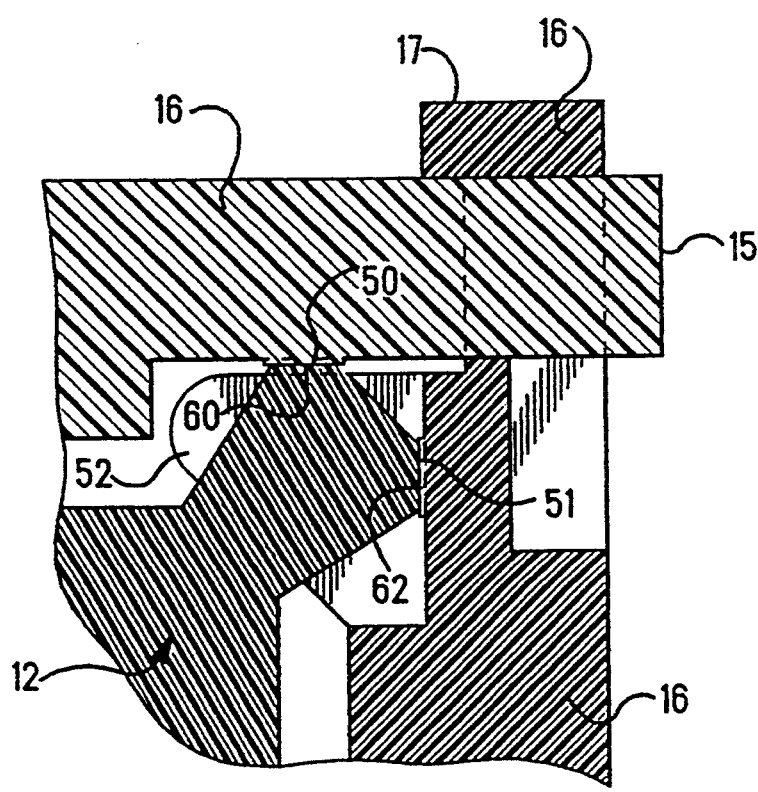
FIG. 7 is a fragmentary sectional view from below showing the manner in which the corners of the flat-pack fit into the cover in this preferred embodiment.

Such an assembly is shown in FIGS. 5 and 6, wherein the four cover arms 16 are interlocked with each other and pressed onto the top of the flat-pack 12. The flat-pack 12 is provided at each of its corners with an integral corner extension 46, as best shown in FIG. 6. FIG. 7 shows the cover arms 16 are each provided with corresponding pads 50 and 51 positioned to fit closely adjacent and in friction fit with the corresponding beveled sides 60 and 62 of the corner extensions 46 and hold the flat-pack 12 securely, but removably, in position. Preferably also, each cover arm 16 is provided with a horizontal flange 52 (FIGS. 4 and 5) which extend over the adjacent flat-pack corner extension 46 to provide a stop for the flat-pack 12 when it is pressed into the interlocked four-armed cover assembly 14.

During assembly to the socket 10, the flat-pack 12 is moved downwardly into its appropriate position on the socket 10, and each arm 16 is then placed so that it extends in a generally vertical position, whereby its semi-cylindrical stub shaft 28 can be slipped through the slot 30 in the corner piece 26; once thus inserted, the arm 16 can be pivoted downwardly and will be held securely in its pivoting path by the pivot structure of the socket 10.

As each arm 16 is pivoted downwardly, it contacts and is pressed against successive flat-pack contacts 18 along a corresponding edge of the flat-pack 12, starting with those nearer the pivot, and when pivoted even further downwardly, it eventually contacts and holds all of the flat-pack contacts 18 therealong; it will be understood that during the initial portion of the pivoting of the cover arm 16, it will first press against those package contacts 20 nearer to the pivot axis, since they will be encountered first, and these contacts 20 are the first to be forced into their final appropriate positions. Since less than all of the contacts 20 along one side are being thus pressed at any given time, and because at least in the initial portions of the arm motion the urging by the arm 16 is assisted by the lever action of the arm 16, this downward moving of the arm 16 can be made without requiring excessive force. The pivoting of each arm 16 is continued until the recess 32 near the distal end 17 of the arm 16 can be pressed over the corresponding portion 34 of the adjacent cover arm 16, to lock the arms 16 together, with the flat-pack contacts 20 positively urged against the socket contacts 18, as desired.

In order to achieve even action by the arms 16, it is preferred that first one and then another of the four arms be pivoted partially downward to urge a small group of the flat-pack contacts 20 into contact with the corresponding socket contacts 18 near their pivot point, and then pivoted progressively further downward to an intermediate position, and finally still further downwardly to complete the operation. This will eliminate any tendency towards tilting or upsetting of the plane of the flat-pack 12 with respect to the socket 10, and will assure the desired entry of the arms 16 into the respective socket troughs 18A.

In order to provide the desired pressing of the flat-pack contacts 20 into the troughs 18A formed by the socket contacts 18, each arm 16 is provided with a blade-like portion 21 having its lower edge 60 beveled, as shown in FIG. 3; the edges 62 and 64 are formed to assist in maintaining the flat-pack contacts 20 against the socket contacts 18.

There is thereby provided a cover 14 for assuring positive contact between flat-pack contacts 20 and socket contacts 18, which can be installed without requiring excessive forces and can also later be removed easily to enable removal and replacement of the flat-pack 12.

In addition, a quadrilateral cover assembly 14 of the four arms 16 can be provided on the flat-pack 12 before it is assembled to the socket 10, to aid in preventing undesired bending or other damage to the flat-pack contacts 20 during storage, transportation or handling. These contacts 20 are extremely delicate, and are easily broken or deformed so that they would not make proper contact with the socket contacts 18 when placed thereon. When as shown in FIGS. 5 and 6, the cover assembly 14 of arms 16 is mounted on the flat-pack 12, the downwardly depending portion of each arm 21 serves to hold and protect each of the flat-pack contacts 20 against accidental damage.

While the invention has been described with particular reference to specific embodiments in the interest of complete definiteness, it will be understood that it may be embodied in a variety of forms diverse from those specifically shown and described, without departing from the spirit and scope of the invention.

What is claimed is:

1. An assembly of an electronic package, a socket therefor, and a cover, comprising:
    a electronic package of substantially rectangular shape, having two major faces and four sides bounding said faces, and having electrical contacts extending outward along said four sides;
    a socket for receiving said electronic package and having electrical contacts extending from its sides, said socket having a shape congruent with the substantially rectangular shape of said electronic package so that corresponding contacts from said electronic package and from said socket are positioned adjacent to each other, said socket also comprising four pivot means, one near each of its corners;
    a cover comprising four independently pivotable arms each mounted on a corresponding one of said pivot means so as to be pivotable along one of said socket edges from a raised position in which said each arm extends upwardly out of contact with said contacts of said package, to a lowered position in which it presses against said spring contacts of said package to force them into positive contact with said contacts of said socket.

2. The assembly of claim 1, wherein each of said arms is configured at its distal end so that when in its lowered position, it fits over and secures itself to the adjacent one of said arms, near its pivot end.

3. The assembly of claim 1, wherein each of said arms comprises a semi-cylindrical stub shaft near the pivot end thereof; and each of said pivot means on said socket comprises a generally circular opening in which said stub shaft fits rotatably and a passage connecting said opening to the exterior by way of which said stub shaft can be slipped in and out of said opening.

4. The assembly of claim 1, wherein said socket contacts form a trough along each edge of said socket, said package contacts are of a size and position to fit within said socket troughs when urged downwardly therein, and wherein the lower edges of each of said arms is configured to fit within its corresponding trough of socket contacts to urge said contacts of said electronic package against said socket contacts.

5. An assembly of a generally rectangular electronic package having outwardly-extending contacts, a socket therefor having outwardly extending contacts lying just below said package contacts, and a cover structure for urging said package contacts against said socket contacts, wherein:
    said cover comprises four arms each extending at right angles to its adjacent arms, each arm comprising a first pivot member having an axis of pivot extending at right angles to said each arm;
    said socket comprising four pivot members complementary to said pivot members of said arms, one at each corner of said socket and each rotatably mounting a corresponding one of said arm pivot members, said socket pivot members being positioned so that each of said arms can be pivoted downwardly into contact with those of said package contacts extending along a corresponding side of said package to urge them into positive contact with said socket contacts.

* * * * *